United States Patent
Braceras et al.

(10) Patent No.: US 6,262,911 B1
(45) Date of Patent: Jul. 17, 2001

(54) METHOD TO STATICALLY BALANCE SOI PARASITIC EFFECTS, AND EIGHT DEVICE SRAM CELLS USING SAME

(75) Inventors: Geordie Braceras, Essex Junction; William F. Pokorny; Alan L. Roberts, both of Jericho, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/599,774

(22) Filed: Jun. 22, 2000

(51) Int. Cl.[7] .................................................. G11C 11/00
(52) U.S. Cl. ........................................... 365/154; 365/156
(58) Field of Search .................................... 365/156, 154

(56) References Cited

U.S. PATENT DOCUMENTS

| | | | |
|---|---|---|---|
| 4,779,226 | 10/1988 | Haraszti | 365/49 |
| 4,912,675 | 3/1990 | Blake et al. | 365/154 |
| 4,995,001 | 2/1991 | Dawson et al. | 365/154 |
| 5,027,319 | 6/1991 | Lai | 365/156 |
| 5,325,325 | 6/1994 | Azuma | 365/156 |
| 5,353,251 | 10/1994 | Uratani et al. | 365/189.05 |
| 5,386,379 | 1/1995 | Ali-Yahia et al. | 365/49 |
| 5,555,208 | 9/1996 | Nishihara | 365/154 |
| 5,640,341 | * 6/1997 | Bessot et al. | 365/156 |
| 5,686,336 | 11/1997 | Lee | 437/52 |
| 5,715,191 | 2/1998 | Yamauchi et al. | 365/156 |
| 5,751,044 | 5/1998 | Lee | 257/380 |
| 5,774,411 | 6/1998 | Hsich et al. | 365/230.06 |
| 5,828,597 | 10/1998 | Madan | 365/156 |
| 5,870,331 | 2/1999 | Hwang et al. | 365/154 |
| 5,949,706 | 9/1999 | Chang et al. | 365/156 |
| 5,966,317 | 10/1999 | O'Connor | 365/53 |
| 5,977,597 | 11/1999 | Honda | 257/369 |

OTHER PUBLICATIONS

IBM Technical Disclosure Bulletin, "Eight Device Storage Cell", Feb. 1973, pp. 2861–2862.

* cited by examiner

*Primary Examiner*—David Nelms
*Assistant Examiner*—M. Tran
(74) *Attorney, Agent, or Firm*—Schmeiser, Olsen & Watts; Steven Capella

(57) ABSTRACT

A method to statically balance Silicon-On-Insulator (SOI) parasitic effects is disclosed. Additionally, eight device Static Random Access Memory (SRAM) cells using the method are provided. A balanced output stage that creates a particular set of parasitic effects, as seen by a node connected to the output of the balanced output stage, is provided. If the balanced output stages are used at both outputs of a SRAM cell, the nodes to which the outputs of the balanced output stages are connected will see the same parasitic effects when the transistors in the balanced output stages are off. Thus, the balanced output stages can create the same effect on both the true and complement bitlines of an SOI SRAM, thereby balancing both of these lines and improving access times.

20 Claims, 4 Drawing Sheets

US 6,262,911 B1

METHOD TO STATICALLY BALANCE SOI PARASITIC EFFECTS, AND EIGHT DEVICE SRAM CELLS USING SAME

BACKGROUND OF THE INVENTION

1. Technical Field

This invention generally relates to Static Random Access Memories (SRAMs), and more specifically relates to a method to statically balance Silicon-On-Insulator (SOI) parasitic effects, and eight device SRAM cells that use the method.

2. Background Art

Many transistors were previously created by forming each transistor in a "well" of silicon or directly in "bulk" silicon. The wells were specifically doped to both create each transistor and to isolate each transistor from other devices. Although the wells did have some isolation capabilities, these capabilities were and are less than ideal.

Recently, there has been a move to create Silicon-On-Insulator (SOI) integrated circuits. In a SOI integrated circuit, a transistor is formed over an insulator. The insulator completely isolates the transistor from other devices on the integrated circuit and from the "bulk" silicon or substrate. Because of the excellent isolation of SOI technologies, there are quite a bit of performance improvements that are realized when SOI is used instead of well or bulk technologies. The speed improvements for a logic circuit can be as high as 30 percent over the same circuit designed with previous technologies.

Even with these speed improvements, there are some detriments to SOI technologies. For a transistor designed with SOI methods, the body of the transistor will be "floating" because of its extreme isolation from other components. In analog circuitry, such as amplifiers, sense amplifiers, etcetera, where a good balance between transistors is required, the effects of a floating body can create differences that can cause faults. Some of these faults are caused by "parasitic" effects. These effects are called "parasitic" effects because they are unwanted and are detrimental to the circuit. For instance, in Static Random Access Memories (SRAMs), there are differential circuits that are connected to long arrays of cells. These differential circuits depend on balance between their inputs; any imbalance can cause erroneous data or slow the circuit. The parasitic effects of SOI transistors create imbalances in the differential circuits.

What is needed is a method to balance the parasitic effects of SOI transistors in balanced circuits such as SRAM circuits, and also needed are SRAM circuits using the method.

DISCLOSURE OF THE INVENTION

The preferred embodiments of the present invention provide a method to statically balance Silicon-On-Insulator (SOI) parasitic effects, and provide eight device Static Random Access Memory (SRAM) cells using the method. The present invention overcomes limitations of the prior art by providing a balanced output stage that creates a particular set of parasitic effects, as seen by a node connected to the output of the balanced output stage. If the balanced output stages are used at both outputs of a SRAM cell, the nodes to which the outputs of the balanced output stages are connected will see the same parasitic effects when the transistors in the balanced output stages are off. Thus, the balanced output stages can create the same effect on both the true and complement bitlines of an SOI SRAM, thereby balancing both of these lines and improving access times and functionality.

The foregoing and other features and advantages of the present invention will be apparent from the following more particular description of the preferred embodiment of the invention, as illustrated in the accompanying drawings.

BEST MODE(S) FOR CARRYING OUT THE INVENTION

As discussed above, the preferred embodiment of the present invention relates Silicon-On-Insulator (SOI) Static Random Access Memories (SRAMs). A more complete discussion of the problems associated with SOI SRAMs follows in the Overview section. Individuals skilled in the art of SOI SRAMs may wish to proceed to the Detailed Description section of this specification. However, those individuals who are new to SOI SRAMs should read this overview section in order to best understand the benefits and advantages of the present invention.

1. Overview

Figure 4:
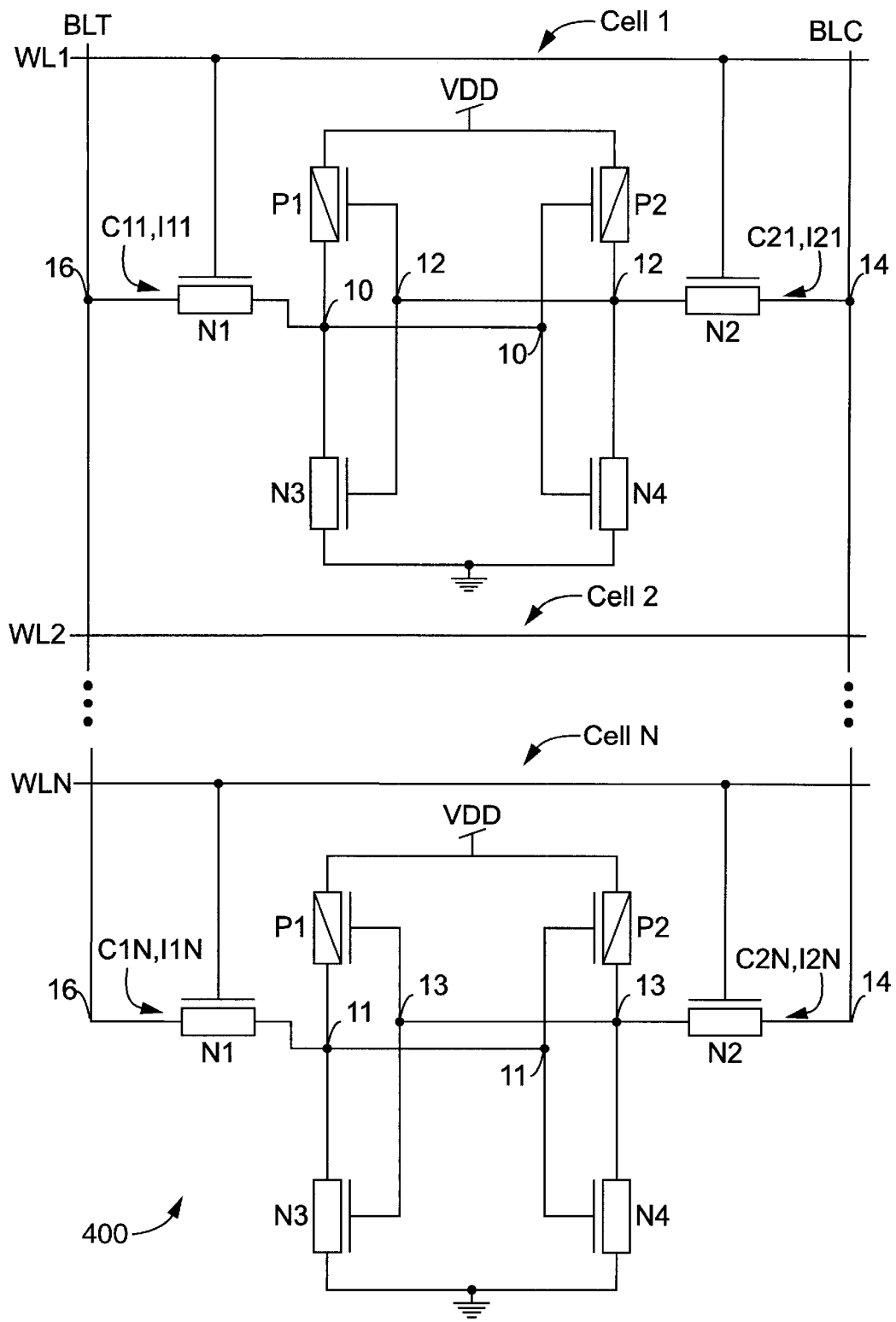
FIG. 4 is a circuit diagram of a prior art integrated circuit having SRAM cells.

Referring now to FIG. 4, this figure shows an integrated circuit 400 having SRAM cells 1 through N. One "column" of SRAM cells is shown. Integrated circuit 400 is formed using SOI technology. Thus, the bodies of the transistors in the figure will be floating. An introduction to and discussion of SOI transistors and some of their parasitic effects are given in Hsieh et al., U.S. Pat. No. 5,774,411, "Methods to Enhance SOI SRAM Cell Stability," issued Jun. 30, 1998, which is incorporated herein by reference.

In FIG. 4, cells 1 through N (of which 1 and N are shown) contain cross-coupled inverters. One inverter is the pull-up P1 and pull-down N3 transistors, while the other inverter is the pull-up P2 and pull-down N4 transistors. In this example, the "P" refers to a P-channel transistor, which is a P-Field Effect Transistor (PFET); the "N" refers to an N-channel transistor or an NFET. In an SRAM cell, the P-channel transistors act like load elements or resistors. Each inverter has an inverted node and a non-inverted node. These inverters are "cross-coupled," meaning that the inverted node 12, 13 of the inverters on the right is coupled to the non-inverted node 12, 13 of the other inverter (on the left in FIG. 4). Similarly, the inverted node 10, 11 of the inverter on the left is coupled to the non-inverted node 10, 11 of the other inverter (on the right in FIG. 4).

Output (also called "pass") transistors N1 and N2 are used to read and write particular cells. Cell 1 has its output transistors N1, N2 controlled by wordline WL1, which is a control input to the output transistors. When WL1 goes high in this example, N1 and N2 go from an off state to an on state, thereby coupling node 16 to node 10 and node 14 to node 12, respectively. Nodes 16 and 14 are part of bitlines true (BLT) and complement (BLC). When cells 1 through N are not being accessed, BLT and BLC are precharged high. In this system, the differential state of BLT and BLC determine the data being written into or read from the cells. To write a binary one into cell 1, for instance, BLT is pulled low while BLC is kept high and WL1 is a high voltage. To write a binary zero into cell 1, the converse occurs: BLT is kept high while BLC is pulled low (both while WL1 is high). When reading the cell, WL1 will be placed high, again coupling nodes 16 and 10 and nodes 12 and 14. BLT and BLC are allowed to "float", thereby allowing output transistors N1 and N2 to change the levels of BLT and BLC. Output transistor N1 connects node 10 to node 16, while output transistor N2 connects node 12 to node 14. If BLT transitions low, the value being read is considered a binary one. In this case, transistor N3 acts to pull the BLT line low while transistor P2 "holds" BLC high. On the other hand, if BLC transitions low, the value being read is considered a binary zero. In this instance, transistor N4 pulls BLC low while transistor P1 "holds" BLT high.

Transistors P1 and P2 are designed to switch the internal state of the cell, but are not necessarily designed to maintain voltage on a bitline or to pull up a bitline. These transistors are designed in this manner because the bitline to which they are connected should be precharged high and will be floating during a read operation. Therefore, these transistors can be made relatively small. Transistors N3 and N4, on the other hand, are designed to pull down the bitlines to which they are connected. Designing SRAM cells such that the bitlines are precharged high is one common practice in operating SRAMs, but it should be clear that other operating principles exist that do not detract from the current invention.

In cell N, wordline N (WLN), which is a control input for output transistors N1 and N2 of cell N, controls output transistors N1, N2 for cell N. Operation of cell N is the same as operation of cell 1, except that WLN is used instead of WL1.

After accessing the cell, circuitry (not shown) in the integrated circuit generally precharges both BLT and BLC high. One reason for this is that BLT and BLC are connected to a differential sense amplifier (not shown), which simply senses the potential difference between BLT and BLC. The sense amplifier senses a small voltage, on the order of 20 to 100 milliVolts (mV), between the bitlines and uses this difference to determine the status of the SRAM cell. Using the difference is very fast, as a circuit does not have to wait for a signal to transition from high to low (or vice versa). Because the difference is used and if noise is introduced into the system, common mode noise is better than differential mode noise. Common mode noise is noise that equally affects both bitlines. On the other hand, differential mode noise is noise that affects one bitline more than or differently than the other bitline. If the noise is common mode, the difference in voltage between the bitlines should be minimally affected by the noise. However, if the noise is differential mode, the difference in voltage between the bitlines will be adversely affected by the noise.

The "worst-case" scenario that affects SOI SRAMs, and for which designers must compensate, occurs when a long column of SRAM cells contain one binary logic value, except for one of the SRAM cells, which contains the opposite binary logic value. For instance, in FIG. 4, assume that cell 1 contains a binary zero. By this, it is meant that node 10 will have a high voltage while node 12 will have a low voltage. Additionally, assume that all other cells between cell 2 and cell N−1 (these other cells are not shown) contain a binary zero, and that cell N contains a binary one. This means that node 11 will be held at a low voltage while node 13 will be held at a high voltage.

In this instance, node 12, which is the signal input of transistor N2 of cell 1 will be a low voltage. Node 14, which is the signal output of transistor N2 of cell 1, will normally be a high voltage. This is true because the BLT and BLC are normally charged high when cells are not being accessed. Also, node 10, the input signal to transistor N1 of cell 1, is a high voltage, as is node 16, the output signal to transistor N1 of cell 1. When transistors N1 and N2 are in an "off" state, meaning that a voltage less than the turn-on voltage is applied to the gate of the transistor (such that no N-channel is formed in the body of the transistor), and BLT and BLC are being held at the same potential, the cell 1 itself is in a static state. This static state is the state of the cell for the vast majority of running time.

In this state, the potential difference between node 12 and node 14 causes the body of the transistor N2 of cell 1 to reach some intermediate voltage between the voltage at node 12 (with is normally at the power supply's ground) and the voltage at node 14 (the power supply's high voltage, VDD). The reason that the body reaches this voltage is because the body, in SOI, is isolated by the isolation and is floating. In a normal well method of creating transistors, the well is generally tied to a power supply (ground or high voltage) and the body potential will therefore be fixed. In SOI technologies, however, there is nowhere for the charge to go, so the body charges to an intermediate voltage. The body of transistor N1 in cell 1 charges to a potential near the potential between nodes 10 and 16, and will therefore settle to approximately VDD.

Parasitic effects such as capacitance (indicated by C11 and C21) and leakage current (indicated by I1 and I21) are related to the potential on the body of the transistor when the transistor is in an off state. In general, there will be less leakage current but more capacitance when the body of a transistor is charged to a high voltage than there will be when the body of a transistor is charged to an intermediate voltage. Thus, C11 and C21 can be very different, and C11 is generally higher in this situation than C21. Similarly, I1 and I21 are also different and I11 is generally lower in this situation than I21.

The opposite situation occurs in cell N. In this cell, node 11 is a low voltage, while node 13 is a high voltage. The voltage differences between node 16 (VDD) and node 11 (ground) cause the body of transistor N1 in cell N to be charged to an intermediate value. The body of transistor N2 is at a high voltage (VDD) due to having high voltages at nodes 13 and 14. Again, C1N will be different from C2N, and I1N will be different from I2N.

Cells 2 through N−1, not shown, also are in states similar to cell 1's state. During its static state, each cell of cells 2 through N−1 has relatively high leakage current and lower capacitance on the BLC. Additionally, each cell has relatively low leakage current and higher capacitance on the BLT.

A problem occurs when cell N is accessed during a read cycle. Cell N is read by forcing WLN high and allowing BLT and BLC to float. BLT and BLC will be floating from their precharged high states. Forcing WLN high activates transistors N1 and N2 in cell N. BLT will be pulled low through transistors N1 and N3 of cell N. Transistor N2 of cell N is essentially cutoff initially because nodes 13 and 14 and WLN are all high. A binary one is read out of the cell by generating a differential voltage between node BLC and BLT, which means having BLT drop low relative to BLC. BLT is actively pulled down versus BLC floating high. In order to generate a valid logical signal, cell N must overcome any built-in differences between nodes BLT and BLC before enough signal margin has developed for reliable sensing. Leakage currents I21 through I2(N−1) will cause node BLC to droop from its precharged state, detracting from the voltage difference between BLT and BLC when BLT is being driven low. Capacitances C11 through C1(N−1) will be highest when cells 1 through N−1 contain a logical zero, making it harder for cell N to discharge node BLT and generate an adequate differential.

Thus, the parasitic effects cause one bitline, BLC, to react in the same manner—at least initially—as the other bitline, BLT. It should be noted that capacitances C11 through C1(N−1) are higher and currents I11 through I1(N−1) are smaller than are capacitances C21 through C2(N−1) and I21 through I2(N−1), respectively. Because of the differences in capacitances and leakage currents between the bitlines, each bitline reacts differently when one cell is accessed and when any noise is injected into the system. Essentially, the parasitic effects of the SOI output transistors act to increase or exacerbate differential mode noise when the output transistors in a column are static and one cell in a column is being accessed. In SRAM design, significant design time is spent to ensure that the bitlines and output transistors are the same, yet SOI technology introduces parasitics that automatically defeat this practice by creating inherent differences between the bitlines and the output transistors on each side of the column.

If the number of cells is small—in other words, if N is small—then the parasitic effects of the SOI output transistors will be relatively small. For example, if N=64, then the effects of the parasitics caused by the SOI output transistors will be small. When N gets to be larger, such as 512, 1024, or even higher, then these parasitic effects also become larger.

It is possible to simply wait longer, until cell N's active current, through devices N1 and N3, can overcome the differential noise between BLT and BLC caused by parasitic capacitances and leakage currents. Another method of solving this dilemma is to put fewer cells on the bitlines. In this method, efficiency is lost, and one has to segment the SRAM a lot, causing more control blocks to be used. A further method for dealing with parasitics is to precharge the bitlines to some value less than VDD, such as VDD/2. However, this requires larger PFETs P1 and P2 to drive the bitlines high. Additionally, the circuitry in the precharge circuits is more complex to create the mid-level precharge.

Thus, what is needed is a method and SRAM cells that balance these parasitic effects.

2. Detailed Description

The preferred embodiments of the present invention provide a method to statically balance Silicon-On-Insulator (SOI) parasitic effects, and provide eight device Static Random Access Memory (SRAM) cells using the method. The present invention overcomes limitations of the prior art by providing a balanced output stage that creates a particular set of parasitic effects, as seen by a node connected to the output of the balanced output stage. If the balanced output stages are used at both outputs of a SRAM cell, the nodes to which the outputs of the balanced output stages are connected will see the same parasitic effects when the transistors in the balanced output stages are off. Thus, the balanced output stages can create the same effect on both the true and complement bitlines of an SOI SRAM, thereby balancing both of these lines and improving access times.

Each balanced output stage is formed by providing a balancing transistor opposite an output transistor. The signal output of the balancing transistor is connected to the signal output of the output transistor. The signal input of the output transistor is coupled to an inverted node of one inverter of a cross-coupled pair of inverters. The signal input of the balancing transistor, by contrast, is connected to a non-inverted node of the other inverter in the cross-coupled pair. The balancing transistor is placed in an off state, preferably by coupling a control input of the balancing transistor to a predetermined voltage selected to place the balancing transistor in the off state. "Off state," for a Field Effect Transistor (FET), means that no channel develops in the body of the transistor. For N-channel Field Effect Transistors (NFETs), this means that the gate voltage must be less than the threshold voltage. For P-channel FETS (PFETS), this means that the gate voltage must be greater than the power supply voltage (VDD) minus the threshold voltage. In the following discussion, the gate input is called the control input. In the most preferred embodiment of the present invention, the balancing transistor and output transistor are N-channel Field Effect Transistors (NFETs), so the control input of the balancing transistor is permanently coupled to ground.

Thus, when the SRAM cell is in a static state, such that the cell is not being accessed and BLT and BLC are high voltages, the output transistor will have a particular potential difference between its signal input and output. This potential difference will be either approximately VDD (when the signal input to the output transistor is a binary zero and the bitline is a binary one) or zero (when both the signal input to the output transistor and the bitline are binary ones). The balancing transistor will have the opposite potential difference across its signal input and output. In other words, when the potential difference across the output transistor is a binary one, the potential difference across the balancing transistor is a binary zero; when the potential difference across the output transistor is a binary zero, the potential difference across the balancing transistor is a binary one.

From the point of view of the output node or of a bitline "looking" into the output of the balanced output stage, one capacitance and one leakage current are seen. Additionally, any other parasitic effects should be one certain value. When these balanced output stages are used on both sides of an SRAM cell, both the bitline true (BLT) and bitline complement (BLC) should "see" the exact same parasitic effects, including capacitance and leakage current. Thus, BLT and BLC will be balanced using the current invention. The primary benefit of balancing parasitic effects is to increase common mode effects and noise while decreasing differential mode effects and noise. Therefore, faster speed SOI SRAMs should be possible using the current invention. In addition, design should be easier because a designer will know that each side of an SRAM—and in fact each column of an array of SRAMs—will be balanced.

It should be noted that the primary effect and benefit of the invention occurs when the SRAM cell is static. When an SRAM cell is static, meaning that the cell is not being read or written and BLC and BLT are charged high, the output transistors are in an off state and the parasitic effects on each side of the column—at BLC and BLT—caused by the SRAM cell are the same. When the SRAM cell is accessed, however, the output transistors will transition from their off state to an on state, thereby creating channels in the body of the transistor and allowing current to flow in the channel. The voltage on the body of the transistor will then change. Conversely, the balancing transistors will still be in an off state. Therefore, the parasitic effects, as seen by BLC and BLT for this single SRAM cell, will no longer be balanced.

Regardless, the parasitic effects of all of the other SRAM cells on the column will still be balanced because most SRAM cells in a column will be static: Only one SRAM cell in a column may be read at any one time. Thus, the benefit of balancing the parasitic effects of SRAM cells will constantly be in effect.

Figure 1:
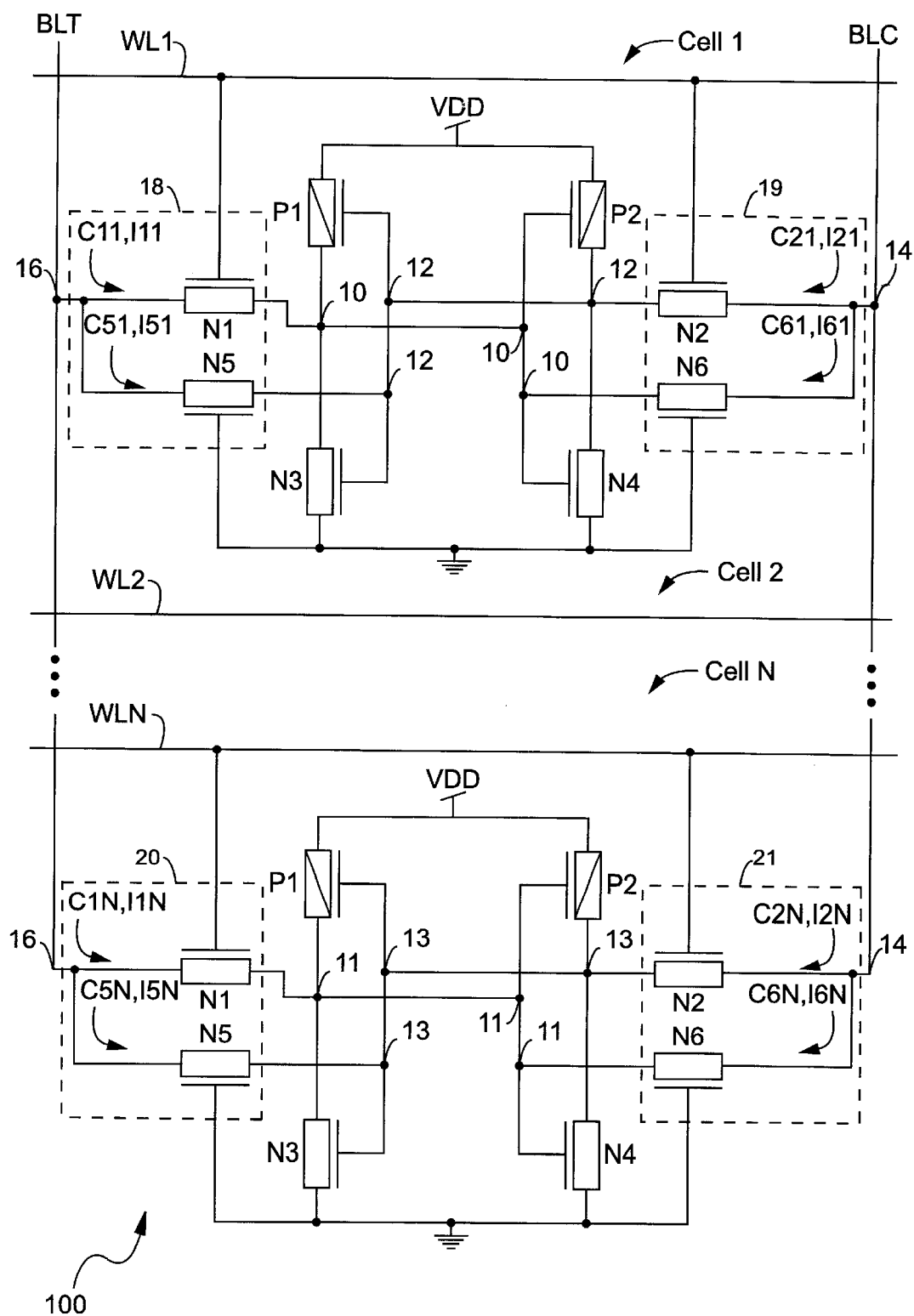
FIG. 1 is a circuit diagram of an integrated circuit having Static Random Access Memory (SRAM) cells, in accordance with the most preferred embodiment of the present invention.

Turning now to FIG. 1, this figure shows an integrated circuit 100 that comprises many SRAM cells 1 through N. Cells 1 and N are shown in this FIG. 1. Integrated circuit 100 is preferably a SRAM column created with SOI technology. Each transistor, therefore, is isolated from other transistors, and each transistor's body is floating. Each cell in the column is accessed through a wordline WL1 through WLN. Bitline True (BLT) and Bitline Complement (BLC) read and write a bit and an inverted bit, respectively. Nodes 14 and 16 are coupled to the outputs of each cell and to the bitlines BLC and BLT, respectively.

Each SRAM cell 1 through N has a pair of cross-coupled inverters. In cell 1, the first inverter is comprised of P2 and N4 and has non-inverted node 10 and inverted node 12. Similarly, in cell N, the first inverter is comprised of P2 and N4 and has non-inverted node 11 and inverted node 13. The "P" indicates that transistor P2 is a P-channel transistor, while the "N" indicates that transistor N4 is an N-channel transistor. Transistor P2 is a pull-up transistor, "pulling up" inverted node 12 or 13 to VDD when the P2 transistor for cell 1 or N, respectively, is active. Transistor N4 is a pull-down transistor that pulls down node 12 or 13 to ground when transistor N4 is active in cell 1 or N, respectively. In cell 1, the second inverter is comprised of transistors P1 and N3 and has non-inverted node 12 and inverted node 10. In cell N, the second inverter is comprised of transistors P1 and N3 and has non-inverted node 13 and inverted node 11. The inverters are cross-coupled because the inverted node 12 (using cell 1 as an example) of the first inverter (P2, N4) feeds into the non-inverted node 12 of the second inverter (P1, N3), and because the inverted node 10 of the second inverter (P1, N3) feeds into the non-inverted node 10 of the second inverter (P2, N4). A "normal" SRAM cell would be completed by output transistors N1 and N2 of each cell 1 through N that couple to the output nodes 16 and 14, respectively.

The present invention provides balanced output stages 18, 19, 20, 21. In balanced output stage 18, transistor N5 is added to "mirror" transistor N1. In balance output stage 18, the signal output of N5 is coupled to node 16, the signal input is coupled to node 12, and the control input is in this example coupled permanently to ground. Similarly, in balanced output stage 20, transistor N5 is added to mirror transistor N1. In balanced output stage 20, the signal output of N5 is coupled to node 16, the signal input is coupled to node 13, and the control input is coupled permanently to ground. In balanced output stage 19, transistor N6 is added to mirror transistor N2. In balanced output stage 19, the signal output of N6 is coupled to node 14, the signal input is coupled to node 10, and the control input is in this example coupled permanently to ground. Similarly, in balanced output stage 21, transistor N6 is added to mirror transistor N2. In balanced output stage 21, the signal output of N6 is coupled to node 14, the signal input is coupled to node 11, and the control input is coupled permanently to ground.

When SRAM cell 1 is in a static state, with BLT and BLC at a high voltage and WL1 at a voltage selected to place transistors N1 and N2 in an off state, the potential difference across balancing transistor N5 will be opposite the potential difference across output transistor N1. For example, if node 10 is a high potential (approximately VDD, which is the power supply's high voltage rail), node 12 will be a low potential (approximately ground). The potential difference between nodes 16 and 10 will be approximately zero (Vdd−VDD=0), while the potential difference between nodes 16 and 12 will be approximately VDD (VDD−0=VDD). Therefore the body of transistor N1 will charge to and remain at a particular voltage (VDD) and the body of transistor N5 will charge to and remain at another voltage (somewhere between VDD and ground).

Due to each body's different body voltage, the capacitances C11 and C51 will be different. Also, leakage currents I11 and I51 will also be different. It should be noted that the arrows in FIG. 1 are not necessarily indicating current flow, but are instead used to indicate what nodes 16 and 14 "see" as parasitic effects from their points-of-view.

On the other side of the column and when SRAM cell 1 is in a static state, the potential difference across balancing transistor N6 will be opposite the potential difference across output transistor N2. Using the previous example, node 10 is a high potential, and node 12 is a low potential. The potential difference between nodes 14 and 12 will be approximately VDD, while the potential difference between nodes 14 and 10 will be approximately zero. Therefore the body of transistor N2 will charge to and remain at a particular voltage (somewhere between VDD and ground) and the body of transistor N6 will charge to and remain at another voltage (VDD).

Due to each body's different body voltage, the capacitances C21 and C61 will be different. Also, leakage currents I61 and I21 will also be different. However, C2 1 and I21 should be exactly the same as C51 and I51, respectively. This occurs because transistors N2 and N5 have the same body voltage and the same potential difference between their signal inputs. Note that this assumes that N2 and N5 are the same transistors having the same physical geometry (width, length, gate oxide material and thickness, etc.). Moreover, C11 and I11 should be exactly the same as C61 and I61, respectively. This occurs because transistors N1 and N6 have the same body voltage and the same potential difference between their signal inputs. Note that this assumes that N1 and N6 are the same transistors having the same physical geometry (width, length, gate oxide material and thickness, etc.).

From the point of view of nodes 16 and 14, each balanced output stage 19, 18, respectively, will have the same capacitance, leakage current, and other parasitic effects. Thus, the current invention balances these nodes and the BLT and BLC. Moreover, when one SRAM cell of N SRAM cells is being accessed, all of the (N−1) SRAM cells' balanced output stages will have the same parasitic effects. Each side of the entire column (other than the cell being accessed) quantitatively has the same parasitic effects. Thus, the problem of the prior art—where one side of the column had different parasitic effects due to the differences in static body voltages—is ameliorated by the present invention. The present invention essentially places an equal number of ones and zeros on each bitline, thereby balancing the bitlines from parasitic effects that would otherwise have created a differential noise between the bitlines.

Even when BLT and BLC move away from their normally high voltages, such as when reading or writing a SRAM cell, N5 and N6 act to balance the parasitic effects on the SRAM cells that are not being accessed.

Thus, when SRAM cell N (for instance) will be accessed, to read or write to the cell, the parasitic effects of SRAM cell 1 and SRAM cells 2 through (N−1) (not shown) will be mirrored on each bitline. In other words, the parasitic effects of each SRAM cell will be the same on both BLT and BLC. Any noise injected into the system should couple into BLT and BLC equally. In other words, the system of FIG. 1 should make injected noise be common mode noise. Because a differential sensing amplifier uses differences between the bitlines to determine the state of a SRAM cell, noise that equally couples into both bitlines is much less detrimental than noise that couples into one bitline more than another.

In prior art SOI SRAMs, each SRAM cell could have different capacitance, leakage current, and other parasitic effects. These effects are exacerbated during a worst-case scenario, which occurs when all SRAM cells contain a binary one and one SRAM cell contains a binary zero, or vice versa. In this situation, each bitline will experience dramatically different parasitic effects. Moreover, any noise that is placed on both bitlines tends to couple unequally into each bitline because of the capacitance and other parasitic differences between each line.

In the invention of FIG. 1, because each bitline sees the same parasitic effects for each SRAM cell, the capacitance will be equal for BLT and BLC and noise injected onto both bitlines will tend to couple equally into the bitlines. Thus, the present invention forces noise to be common mode and prevents noise from being differential.

It should be noted that the control input voltages discussed above are predetermined and selected to turn off the balancing transistor and to activate or turn off the other transistors, depending on the state of the SRAM cell.

An integrated circuit 100, as shown in FIG. 1, enables a designer to immediately know that parasitic effects will be balanced between BLT and BLC. There should be no parasitic mismatches between BLT and BLC. Thus, the present invention makes design, particularly for "growable" arrays of SRAMs, easier for the designer.

The detriments to the present invention are increased surface area for each SRAM cell, and increased capacitance and potentially increased leakage currents for each cell. However, each cell has the same capacitance and leakage currents for each bitline. Depending on the design of the integrated circuit, the area impact of an SRAM cell in accordance with the current invention will range about 15 percent more than a "normal" SRAM cell.

Figure 2:
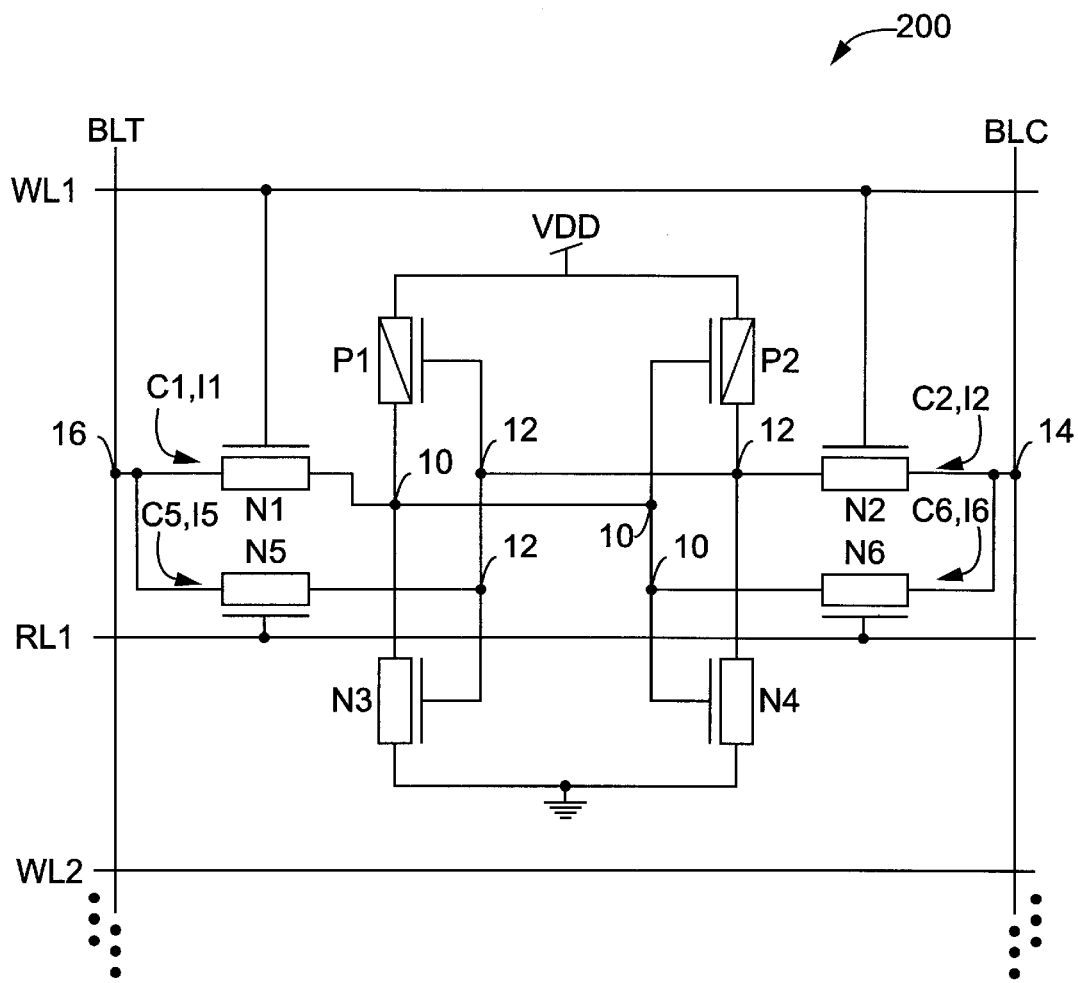
FIG. 2 is a circuit diagram of a preferred SRAM cell, in accordance with a preferred embodiment.

Referring now to FIG. 2, a second preferred embodiment of the present invention is shown. In this embodiment, an integrated circuit 200 has a column of SRAM cells, of which one exemplary cell is shown. The difference between this SRAM cell and the cells of FIG. 1 is the RL1 read line. This read line is used to read out the complement of the data. WL1, the write line for SRAM cell 1, is used to write in the data. Date read from the cell, using transistors N5 and N6 (controlled by RL1), will be the opposite of data written into the cell, using N1 and N2 (controlled by WL1 ). It should be noted that data might be written with RL1 and read with WL1, or written and read by both WL1 and RL1.

The SRAM cell of FIG. 2 allows the data in the cell to be complemented merely by using RL1 instead of WL1 to read the data. BLT and BLC will each have complemented data during a read by activating RL1. In other words, if BLT writes a binary high into the cell (transistors N1 and N2 are active by an appropriate voltage on WL1) while BLC writes a binary low into the cell, a read by using RL1 (and activating N5 and N6 through an appropriate voltage on RL1) will read out a binary low value on BLT and a binary high value on BLC.

Note that this configuration still has the benefits of the embodiment of FIG. 1, because RL1 (or WL1) will be a low value much of the time and transistors N5 and N6 (or transistors N1 and N2) will be in an off state during this time.

Figure 3:
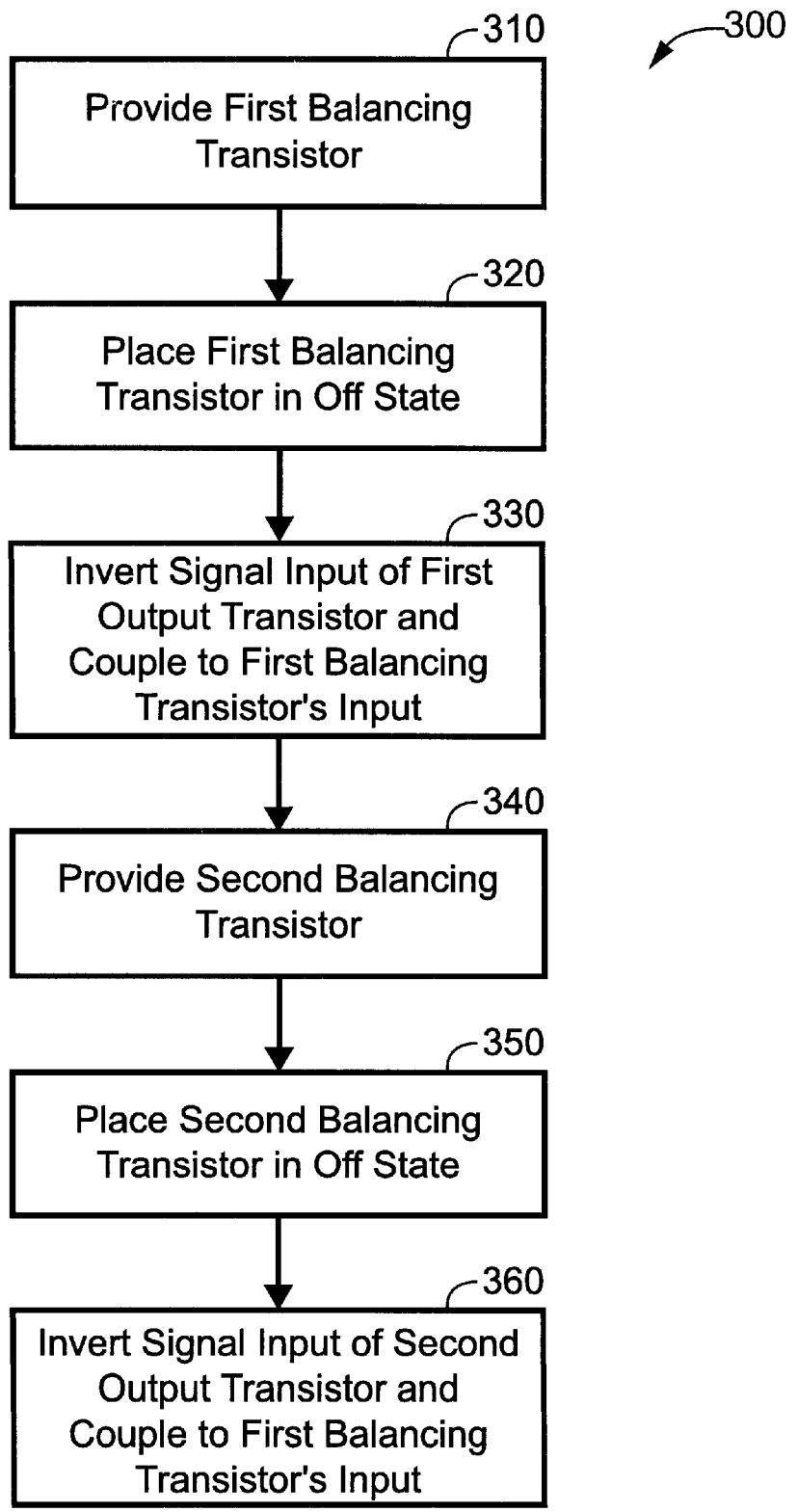
FIG. 3 is a method of balancing Silicon-On-Insulator (SOI) parasitic effects in accordance with a preferred embodiment of the present invention.

Referring now to FIG. 3, a method 300 is shown for statically balancing parasitic effects in a Silicon-On-Insulator (SOI) integrated circuit. Method 300 is used whenever a good balance between transistors is required on an SOI integrated circuit. In particular, the method is helpful for analog circuitry, such as amplifiers, sense amplifiers, etcetera, where the effects of a floating body can create differences between transistors that can cause faults. The method 300 has tremendous benefits, as described above, for SOI SRAMS.

Method 300 is used when it is desired to balance the SOI parasitic effects caused by two output transistors. It should be noted that these method steps are not necessarily in order, unless an order is required. Referring to FIG. 1 in addition to FIG. 3, in cell N of FIG. 1, this cell has output transistors N1 and N2. Method 300 will balance the parasitic effects, as seen by nodes 16 and 14, by output transistors N1 and N2, respectively.

Method 300 begins when a first balancing transistor is provided (step 310) to mirror one of the output transistors. In the example of FIG. 1, transistor N6 is provided and the output of transistor N6 is coupled to the output node 14 of transistor N2 of cell N. In step 320, this balancing transistor is placed in an off state. In the example of FIG. 1, balancing transistor N6 is placed in an off state by coupling the control input of the balancing transistor permanently to ground. In step 330, the signal input 13 of output transistor N2 is inverted and coupled to the balancing transistor's N6 input. In this example, node 11 (which is an inverted node 13) is connected to the balancing transistor's N6 input. From the point of view of node 14, when both transistors N2 and N6 are off, the capacitances, leakage currents, and other parasitics, will each be one particular value.

A second balancing transistor is provided (in step 340) to mirror one of the output transistors. In the example of FIG. 1, transistor N5 is provided and the output of transistor N5 is coupled to the output node 16 of transistor N1 of cell N. In step 350, this balancing transistor is placed in an off state. In the example of FIG. 1, balancing transistor N5 is placed in an off state by coupling the control input of the balancing transistor permanently to ground. In step 360, the signal input 11 of output transistor N1 is inverted and coupled to the balancing transistor's N5 input. In this example, node 13 (which is an inverted node 11) is connected to the balancing transistor's N5 input. From the point of view of node 16, when both transistors N1 and N5 are off, the capacitances, leakage currents, and other parasitics, will each be one particular value.

Both nodes 16 and 14 are now balanced in the sense that capacitances, leakage currents, and other parasitics are mirrored on each output node 16, 14. For those applications needing balanced transistors, the method 300 of FIG. 3 provides statically balanced transistors.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the forthcoming claims.

What is claimed is:

1. A Static Random Access Memory (SRAM) cell comprising:
   first and second cross-coupled inverters, each inverter comprising inverted and non-inverted nodes;
   a first output transistor connected between the inverted node of the first inverter and a first output node;
   a second output transistor connected between the inverted node of the second inverter and a second output node;
   a first balancing transistor connected between the non-inverted node of the first inverter and the first output node, wherein the first balancing transistor is in an off state;
   a second balancing transistor connected between the non-inverted node of the second inverter and the second output node, wherein the second balancing transistor is in an off state; and
   whereby parasitic effects at the output nodes will be balanced when the first and second output transistors are in the off state.

2. The SRAM cell of claim 1 wherein the first node is coupled to a first bitline and the second node is coupled to a second bitline, and wherein each of the first and second output transistors further comprise a control input coupled to a wordline.

3. The SRAM cell of claim 1 wherein each of the first and second balancing transistors comprise a control input, and wherein each control input is coupled to a predetermined voltage selected to place each first and second balancing transistor in the off state.

4. The SRAM cell of claim 3 wherein each of the first and second balancing transistors comprise a control input, wherein the first output node is coupled to a first bitline and the second output node is coupled to a second bitline, wherein each control input of the first and second balancing transistors is coupled to a read line, wherein the read line is coupled to a predetermined voltage selected to place each first and second balancing transistor in the off state when the SRAM cell is not being accessed, and whereby activating the read line will cause a complement of data in the at least one SRAM cell to appear on the first and second bitlines.

5. The SRAM cell of claim 3 wherein each of the first and second balancing transistors and each of the first and second output transistors are N-channel transistors, wherein each of the first and second balancing transistors comprise a control input, and wherein each control input of the first and second balancing transistors is coupled permanently to ground.

6. The SRAM cell of claim 1 wherein the first inverter comprises a first pull-up transistor and a first pull-down transistor, and wherein the second inverter comprises a second pull-up transistor and a second pull-down transistor.

7. The SRAM cell of claim 6 wherein the first and second pull-up transistors are P-channel transistors and wherein the first and second pull-down transistors are N-channel transistors.

8. The SRAM cell of claim 1 wherein each of the first and second output transistors and the first and second balancing transistors are of the same type.

9. The SRAM cell of claim 8 wherein each of the first and second output transistors and the first and second balancing transistors are N-channel transistors.

10. An integrated circuit comprising:
    a plurality of complement bitlines;
    a plurality of true bitlines;
    a plurality of wordlines;
    a plurality of Static Random Access Memory (SRAM) cells, each of the plurality of SRAM cells coupled to one of the wordlines, one of the true bitlines, and one of the complement bitlines, at least one of the SRAM cells comprising:
       first and second cross-coupled inverters, each inverter comprising inverted and non-inverted nodes;
       a first output transistor connected between the inverted node of the first inverter and one of the complement bitlines and comprising a control input coupled to one of the wordlines;
       a second output transistor connected between the inverted node of the second inverter and one of the true bitlines and comprising a control input coupled to the one wordline;
       a first balancing transistor connected between the non-inverted node of the first inverter and the one complement bitline and comprising a control input coupled to a predetermined voltage selected to place the first balancing transistor in an off state; and
       a second balancing transistor connected between the non-inverted node of the second inverter and the one true bitline and comprising a control input coupled to a predetermined voltage selected to place the second balancing transistor in an off state; and
    whereby parasitic effects at each bitline caused by the at least one SRAM cell will be balanced when the first and second output transistors are in the off state.

11. The integrated circuit of claim 10 wherein the first inverter comprises a first pull-up transistor and a first pull-down transistor, and wherein the second inverter comprises a second pull-up transistor and a second pull-down transistor.

12. The integrated circuit of claim 11 wherein the first and second pull-up transistors are P-channel transistors and wherein the first and second pull-down transistors are N-channel transistors.

13. The integrated circuit of claim 10 wherein each of the first and second balancing transistors and each of the first and second output transistors are N-channel transistors, and wherein the control inputs of the first and second balancing transistors are permanently coupled to ground.

14. The integrated circuit of claim 10 further comprising a plurality of read lines, wherein each of the SRAM cells is coupled to a read line, wherein the control inputs of the first and second balancing transistors are each coupled to one of the read lines, whereby parasitic effects at each bitline caused by the at least one SRAM cell will be balanced when the first and second output transistors are in the off state and when the one read line is coupled to a predetermined voltage selected to place the first and second balancing transistors in an off state, and whereby activating the read line will cause a complement of data in the at least one SRAM cell to appear on the one true bitline and the one complement bitline.

15. A method for statically balancing parasitic effects in a Silicon-On-Insulator (SOI) integrated circuit having a first output transistor coupled to a first node and a second output transistor coupled to a second node, the first output transistor comprising a signal output coupled to the first node and comprising a signal input, the second output transistor comprising a signal output coupled to the second node and comprising a signal input, the method comprising the steps of:
    providing a first balancing transistor comprising a signal input and a signal output, wherein the signal output of the first balancing transistor is coupled to the first node;
    placing the first balancing transistor in an off state;
    inverting the signal input of the first output transistor;
    coupling the inverted signal input of the first output transistor to the signal input of the first balancing transistor;

providing a second balancing transistor comprising a signal input and a signal output, wherein the signal output of the second balancing transistor is coupled to the second node;

placing the second balancing transistor in the off state;

inverting the signal input of the second output transistor;

coupling the inverted signal input of the second output transistor to the signal input of the second balancing transistor; and whereby parasitic effects at the first and second nodes will be balanced when the first and second output transistors are in the off state.

16. The method of claim 15 wherein the step of placing the first balancing transistor in an off state comprises the step of coupling a control input of the first balancing transistor to a first predetermined voltage selected to place the first balancing transistor in the off state, and wherein the step of placing the second balancing transistor in an off state comprises the step of coupling a control input of the second balancing transistor to a second predetermined voltage selected to place the second balancing transistor in the off state.

17. The method of claim 16 wherein each of the first and second balancing transistors are N-channel transistors, wherein the step of coupling a control input of the first balancing transistor to a first predetermined voltage selected to place the first balancing transistor in the off state comprises the step of permanently coupling the control input of the first balancing transistor to ground, wherein the step of coupling a control input of the second balancing transistor to a second predetermined voltage selected to place the second balancing transistor in the off state comprises the step of permanently coupling the control input of the second balancing transistor to ground.

18. The method of claim 16 further comprising the step of providing first and second cross-coupled inverters, each inverter comprising inverted and non-inverted nodes, wherein the second inverter performs the step of inverting the signal input of the first output transistor, and wherein the first inverter performs the step of inverting the signal input of the second output transistor.

19. The method of claim 18 wherein:

the first and second predetermined voltages are the same voltage;

the step of coupling a control input of the first balancing transistor to a first predetermined voltage selected to place the first balancing transistor in the off state comprises the steps of:

coupling the control input of the first balancing transistor to a first read line; and placing the first predetermined voltage on the first read line; and the step of coupling a control input of the second balancing transistor to a second predetermined voltage selected to place the second balancing transistor in the off state comprises the steps of:

coupling the control input of the second balancing transistor to the first read line; and placing the first predetermined voltage on the first read line.

20. The method of claim 19 further comprising the steps of:

writing a binary value by placing a third predetermined voltage on the first node, by placing a fourth predetermined voltage on the second node, and by activating the first and second output transistors; and reading a complement binary value from the first and second nodes by placing a second predetermined voltage on the first read line, wherein the second predetermined voltage is preselected to active the first and second balancing transistors.

* * * * *